United States Patent [19]

Darges et al.

[11] Patent Number: 5,394,118
[45] Date of Patent: Feb. 28, 1995

[54] DIGITAL CIRCUIT FOR THE EXTRACTION OF THE PHASE AND ENVELOPE SIGNALS OF A SINGLE SIDEBAND SIGNAL

[75] Inventors: Bernard Darges, St Leu la Foret; Jean-François Helm, deceased, late of Troarn, by Francois-Louis Helm, Nicole Lelouvier wife Helm, legal representatives; by Véronique Helm wife Gauthier, legal representative, Vanves, all of France

[73] Assignee: Thomson-CSF, Paris, France

[21] Appl. No.: 152,720

[22] Filed: Nov. 16, 1993

[30] Foreign Application Priority Data

Nov. 20, 1992 [FR] France .................... 92 13968

[51] Int. Cl.$^6$ .................................... H03C 1/60
[52] U.S. Cl. .................... 332/170; 375/270; 375/301; 455/47; 455/109
[58] Field of Search ............ 332/170; 455/47, 109; 375/43, 61

[56] References Cited

U.S. PATENT DOCUMENTS

| | | |
|---|---|---|
| 4,593,410 | 6/1986 | Kyrian .................... 332/170 X |
| 4,994,769 | 2/1991 | Kishi . |
| 5,115,468 | 5/1992 | Asahi et al. . |

FOREIGN PATENT DOCUMENTS 0202985 11/1986 European Pat. Off. .
0360990 4/1990 European Pat. Off. .

Primary Examiner—Siegfried H. Grimm
Attorney, Agent, or Firm—Oblon, Spivak, McClelland, Maier, & Neustadt

[57] ABSTRACT

A digital circuit having a first section for converting a low-frequency signal into a sampled single sideband signal, coupled to a second section for separating the sampled SSB signal into its two components, the phase and envelope components.

5 Claims, 3 Drawing Sheets

DIGITAL CIRCUIT FOR THE EXTRACTION OF THE PHASE AND ENVELOPE SIGNALS OF A SINGLE SIDEBAND SIGNAL

BACKGROUND OF THE INVENTION

1. Field of the Invention

The present invention relates to a digital circuit for the extraction of the phase and envelope signals of a single sideband signal.

2. Description of the Prior Art

A known way of obtaining a modulated signal according to the principle of single sideband (hereinafter called SSB) modulation is to separate the SSB signal into its two components, namely the phase and envelope components, in order to apply them by means of two distinct channels to a first input and a second input of the modulation stage of a power stage of an emitter.

Devices such as these are described, for example, in the U.S. Pat. No. 2,666,133, filed on behalf of Mr. KHAN, or again in the European patent application No. 0 202 985, published on Nov. 26, 1986. Other devices working according to this same principle are also known from the published work by Mr. Léonard KHAN, "Single Sideband Transmission by Envelope Elimination and Restoration" in the IRE journal Processing, Vol. 40, No. 7, July 1950, or again the published work by the same author, "Compatible Single Sideband", also published in the I.R.E. journal in July 1961.

The main drawback of these devices is that, notably in shortwave broadcasting applications, they require a highly stable and hence very costly quartz filter to carry out the filtering of one of the two sidebands which are at a distance of only 300 Hz from each other about a carrier frequency located in the region of some MHz. Although entirely digital passband filters have been envisaged, these filters prove to be inapplicable because they are very difficult to make. The recursive filters have their performance characteristics limited by the centers of their transfer function which possess a modulus very close to the unit circle and lead to instabilities. By contrast, the use of recursive filters, which by their very essence guarantee stability, requires computation times that are all the greater as the number of the points at which they are computed is high. For example, to obtain an attenuation of 40 dB of the lower sideband it is necessary, with this approach, to use a finite pulse response filter determined by 4000 points. This is unfortunately incompatible with the transmission times of the receivers. Nor can approaches using Hilbert filters be envisaged for it is very difficult to obtain a gain of 1 with a 90° phase-shift. Furthermore, to obtain attenuation values, for a sideband, of less than 40 dB with phase variations around −90° that do not exceed 1.14, these relationships in theory require sampling frequencies of some megahertz, which it may not be possible to achieve in practice.

SUMMARY OF THE INVENTION

The aim of the invention is to overcome the above-mentioned drawbacks.

To this end, an object of the invention is a digital circuit for the extraction of the phase and envelope signals from a single sideband signal obtained from a sampled low-frequency signal comprising first means to convert the low-frequency signal into a sampled single sideband signal coupled to second means to separate the sampled SSB signal into its two components, the phase and envelope components.

BRIEF DESCRIPTION OF THE DRAWINGS

Other features and advantages of the invention shall appear from the following description, made with reference to the appended drawings, of which.

MORE DETAILED DESCRIPTION

Figure 1:
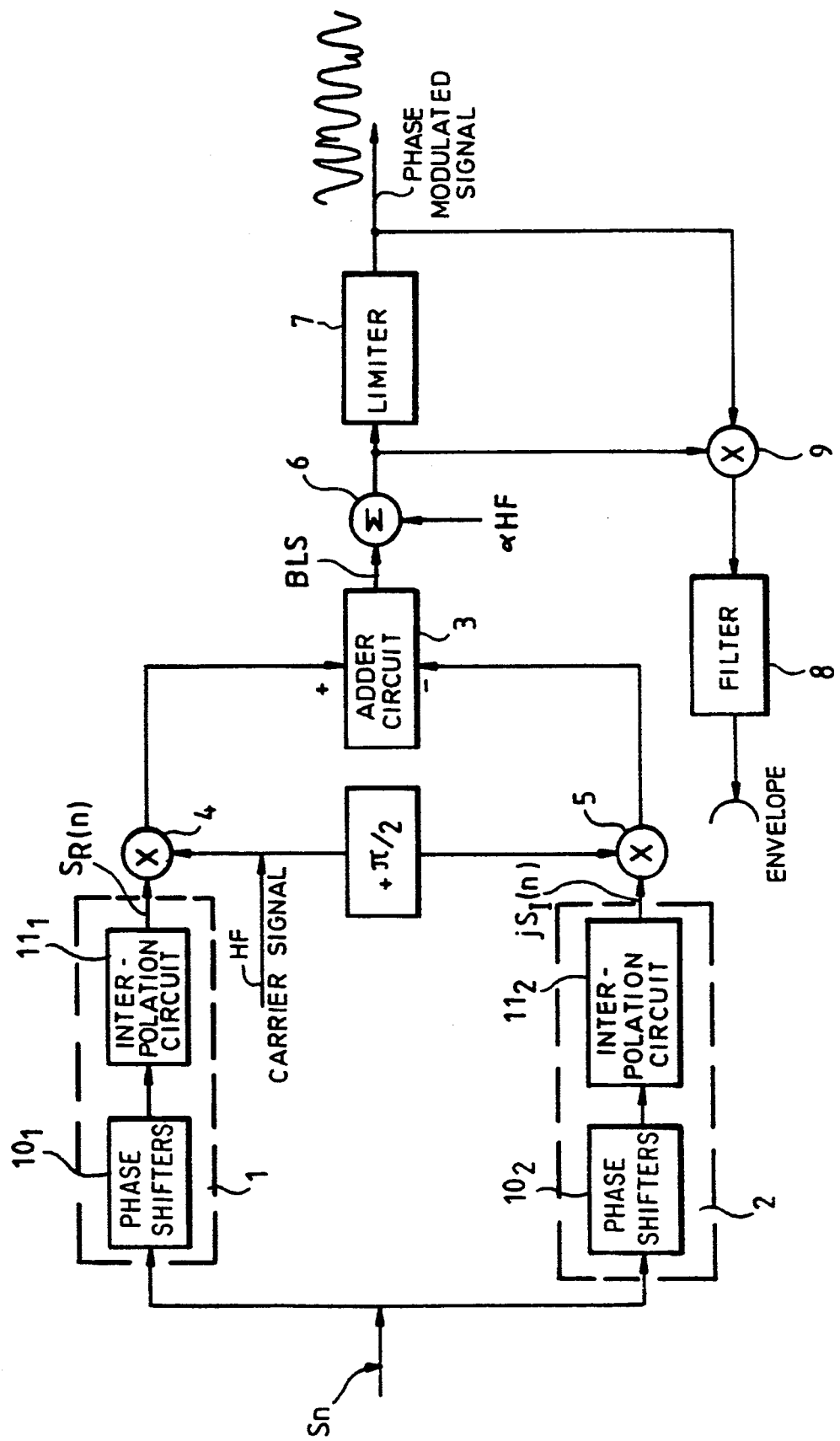
FIG. 1 shows a functional diagram of a device according to the invention.

The device according to the invention, shown in functional form in FIG. 1, comprise a first filtering network and a second filtering network, both supplied with a sequence Sn of digital samples of an LF signal at a frequency $F_{e1}$. According to this organization, the networks 1 and 2 convert the sequence Sn of samples into a complex sequence of samples $S_{A(n)}$ such as $A_{A(n)} = S_{R(n)} + jS_{I(n)}$. The samples $S_{R(n)}$ of the real part of the sequence are obtained at output of the network 1 and the samples $S_{I(n)}$ of the imaginary part are obtained at output of the network 2. The networks 1 and 2 are coupled respectively to a first input referenced "+" and a second input referenced "−" of an adder circuit 3 by means of two multiplier circuits 4 and 5 to multiply the complex sequence $S_{A(n)}$ by a sequence of complex numbers defined by the relationship:

$$\cos(2\pi n F_o) + j \sin(2\pi n F_o) \quad (1)$$

in keeping only the real part $S_{m(n)}$ of the sequence thus obtained. This computation is carried out by the multiplier circuit 4 which takes the product $S_{R(n)} \cdot \cos(2\pi n F_o)$ and by the multiplier circuit 5 which takes the product $S_{I(n)} \cdot \sin(2\pi n F_o)$. The sequence $S_{m(n)}$ that is thus obtained at the output of the adder circuit 3 is a sampled modulated SSB signal having the form:

$$S_{m(n)} = S_{R(n)} \cdot \cos(2\pi n F_o) - S_{I(n)} \cdot \sin(2\pi n F_o) \quad (2)$$

The signal $S_{m(n)}$ is applied to the input of a summator circuit 6 which takes the vector sum, in the Fresnel plane, of the samples $S_{m(n)}$ with the frequency $F_o$ signal. This signal is applied, firstly, to the input of a limiter 7 which gives the phase component and, secondly, to the input of a filter 8 by means of a multiplier circuit 9 to extract the envelope signal.

Figure 2:
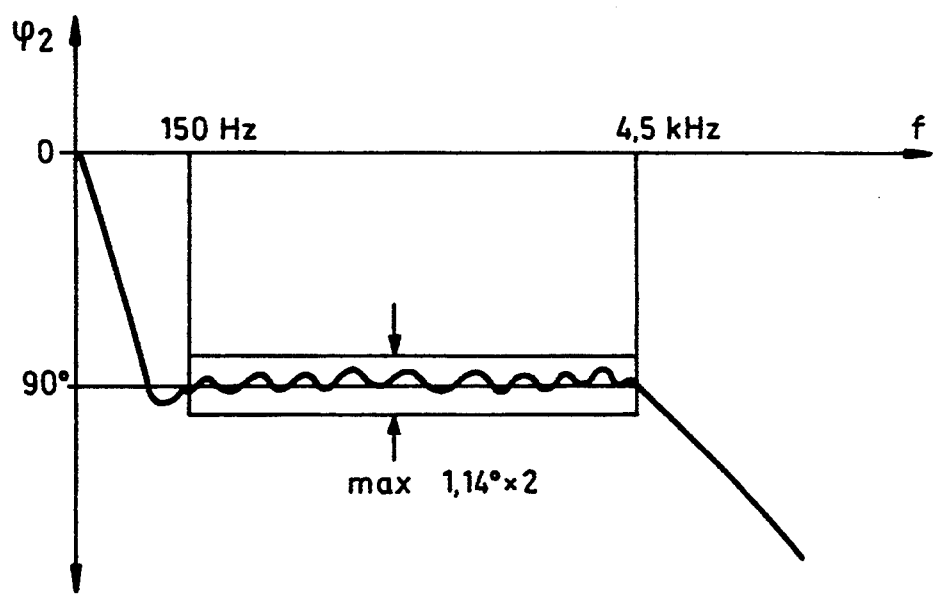
FIG. 2 shows a filter template implemented by the invention.
Figure 3:
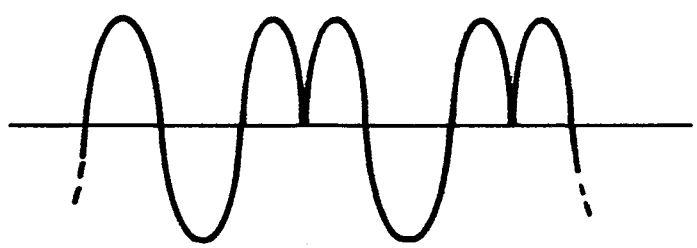
FIG. 3 shows an exemplary sinusoidal signal phase-modulated with the device according to the invention.

Each of the networks 1 and 2 comprises a set of three first-order phase-shifters $10_1$ and $10_2$, the modulus of the poles of which is determined as a function of the sampling frequency $F_{e1}$ of the low-frequency signal and a circuit $11_1$ and $11_2$ for the interpolation of the signal obtained at the output of the phase-shifter working at the sampling frequency $F_{e2}$ of the high-frequency HF carrier of the LF signal. To obtain an attenuation of 40 dB between the two sidebands, the constant proper to each phase-shifter is determined so that the phase difference $\phi_1 - \phi_2$ existing at the output of each of the phase-shifters $10_1$ and $10_2$ is within a filter template having two cut-off frequencies, namely a minimum cut-off frequency and a maximum cut-off frequency, for example 150 Hz to 4.5 KHz with a phase-shift of −90° that does not exceed a phase variation of ±1.14° as is shown in FIG. 2. The limiter 7, for its part, is determined so as to give a sinusoidal signal that is phase-modulated according to a shape similar to the one shown in FIG. 3.

Figure 4:
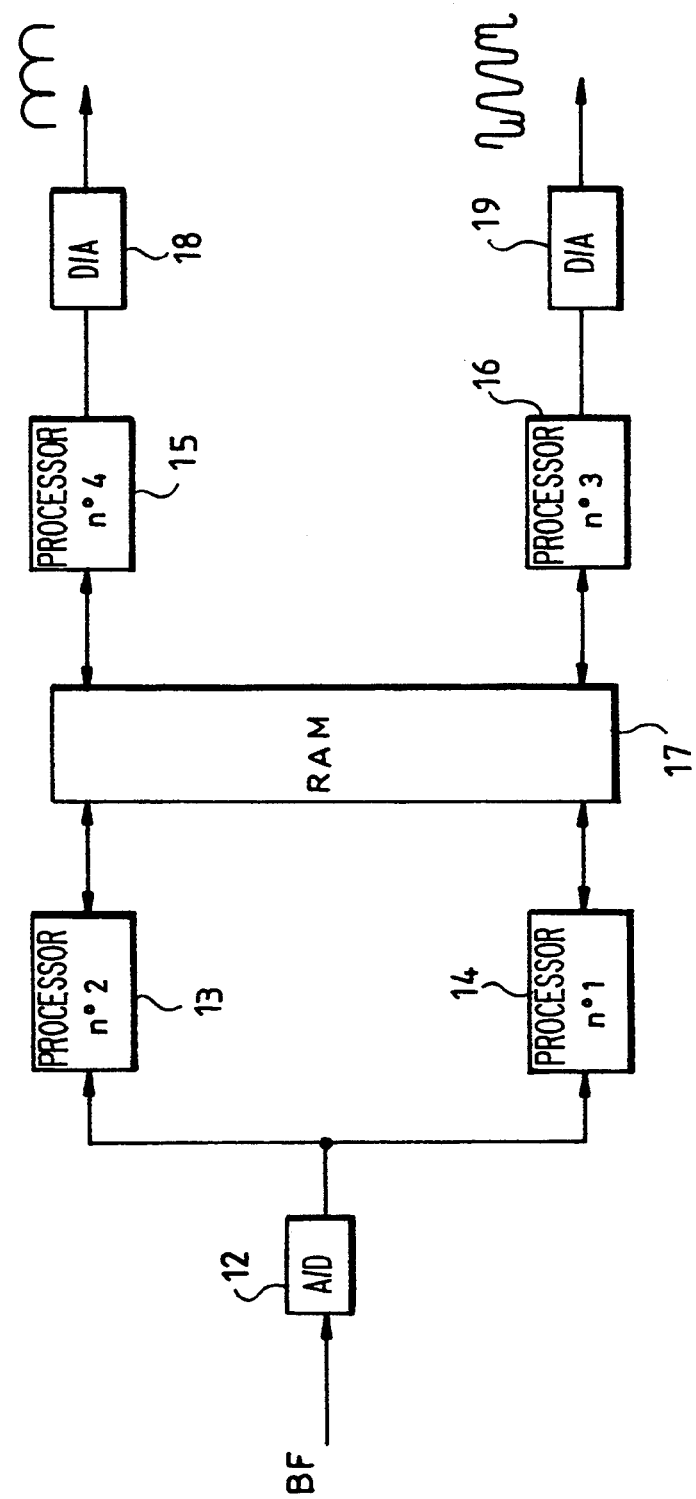
FIG. 4 shows an embodiment of a device according to the invention, obtained by means of four signal processors.

Naturally, the embodiment of the device according to the invention that has just been described is not the only one. It goes without saying that the functions of this device can be achieved in quite different ways notably by using, as shown in FIG. 4, a set of signal processors respectively referenced 13, 14, 15 and 16 coupled by data and address inputs to a random-access memory 17. An analog-digital converter 12 converts the LF signal into samples of digital signals. These signals are applied to the inputs of the processors 13 and 14. These processors respectively compute the sequences of the real signals $S_{R(n)}$ and imaginary signals $JS_{I(n)}$ of the foregoing relationship (2). These samples obtained are all memorized in the random-access memory 27, and their amplitude is then smoothened by the signal processor 15 to compute the envelope signal of the SSB signal. The corresponding envelope signal samples are applied to a digital-analog converter 18 to form the envelope signal of the SSB signal. The phase-modulated signal is computed by the signal processor 16 from samples memorized in the random-access memory 17 which carries out a limiting of the samples by detecting the sign of each of them. The sinusoidal signal is reconstituted from phase-modulated samples given by the processor 16 by means of a digital-analog converter 19.

What is claimed is:

1. A digital circuit for the extraction of the phase and envelope signals from a single sideband (SSB) signal obtained from a sampled low-frequency signal comprising first means to convert the low-frequency signal into a sampled single sideband signal coupled to second means to separate the sampled SSB signal into its two components, the phase and envelope components.

2. A circuit according to claim 1, wherein the first means comprise a first signal processor and a second signal processor for the computation, from the sampled low-frequency signal, of two sequences of samples $S_{R(n)}$ and $S_{I(n)}$ which are respectively real part samples and imaginary part samples.

3. A circuit according to claim 2, wherein the second means comprise third means of storage to store each of the two sequences of samples $S_{R(n)}$ and $S_{I(n)}$, respectively coupled to a third signal processor to compute the envelope signal of the SSB signal and to a fourth signal processor to compute the phase-modulated signal.

4. A circuit according to claim 1, wherein the first means comprise:
a first filtering network and a second filtering network to convert the sampled low-frequency signal $S_n$ into two complex sequences of real part $S_{R(n)}$ and imaginary part $S_{I(n)}$ samples,
an adder circuit coupled respectively by a first input referenced "+" and a second input referenced "−" to the outputs of the first and second networks by means of two multiplier circuits to multiply the complex sequence $S_{A(n)}$ formed out of the imaginary parts $S_{R(n)}$ and $S_{I(n)}$ by a third sequence of complex numbers representing the frequency $F_o$ carrier of the SSB signal and to obtain, at the output of the adder circuit, a sampled, modulated SSB signal $S_{m(n)}$ having the form:

$$S_{m(n)} = S_{R(n)} \cos(2\pi n F_o) - S_{I(n)} \sin(2\pi n F_o)$$

a summator circuit coupled to the output of the adder circuit to compute the vector sum in the Fresnel plane of the samples $S_{m(n)}$ with the carrier having the frequency $F_o$ and a limiter circuit coupled to the output of the summator circuit to give the phase component of the SSB signal.

5. A circuit according to claim 4, comprising a filter circuit coupled to the input and to the output of the limiter circuit by means of a multiplier circuit to extract the envelope component of the SSB signal.

* * * * *